United States Patent
Perez

(10) Patent No.: US 11,795,052 B2
(45) Date of Patent: Oct. 24, 2023

(54) CONSTRAINT FOR A SENSOR ASSEMBLY

(71) Applicant: Measurement Specialties, Inc., Hampton, VA (US)

(72) Inventor: Jose Fernando Alfaro Perez, Milpitas, CA (US)

(73) Assignee: TE CONNECTIVITY SOLUTIONS GMBH, Schaffhausen (CH)

( * ) Notice: Subject to any disclaimer, the term of this patent is extended or adjusted under 35 U.S.C. 154(b) by 10 days.

(21) Appl. No.: 17/036,659

(22) Filed: Sep. 29, 2020

(65) Prior Publication Data
US 2022/0098029 A1    Mar. 31, 2022

(51) Int. Cl.
*B81B 7/00* (2006.01)
*B81C 1/00* (2006.01)
*B81B 3/00* (2006.01)

(52) U.S. Cl.
CPC ...... *B81B 7/0048* (2013.01); *B81B 2203/019* (2013.01)

(58) Field of Classification Search
CPC .................................................. B81B 7/0048
See application file for complete search history.

(56) References Cited

U.S. PATENT DOCUMENTS

| | | | |
|---|---|---|---|
| 6,913,941 B2 * | 7/2005 | O'Brien | B81C 1/00039 438/48 |
| 7,830,003 B2 | 11/2010 | Foster et al. | |
| 2009/0096040 A1 | 4/2009 | Morales et al. | |
| 2012/0264250 A1 * | 10/2012 | Graham | B81B 3/0072 257/E21.214 |
| 2014/0339656 A1 * | 11/2014 | Schlarmann | B81B 7/0048 257/415 |
| 2014/0353772 A1 * | 12/2014 | Stermer, Jr. | B81C 1/00325 438/51 |
| 2015/0353350 A1 * | 12/2015 | Berthelot | B81C 1/00349 438/50 |
| 2016/0090297 A1 | 3/2016 | Zhang et al. | |
| 2016/0229688 A1 * | 8/2016 | Gu | B81B 7/0048 |

FOREIGN PATENT DOCUMENTS

| | | |
|---|---|---|
| JP | 2002530541 A | 9/2002 |
| KR | 20140026473 A | 3/2014 |

OTHER PUBLICATIONS

Stephen Beeby, et al., MEMS Mechanical Sensors, copyright 2004, 281 pages.

Zhiyong Chen, et al., Measurement and Isolation of Thermal Stress in Silicon-On-Glass MEMS Structures, Department of Precision Instruments, Tsinghua University, Beijing 100084, China, dated Jun. 8, 2018, 14 pages.

* cited by examiner

*Primary Examiner* — Omar F Mojaddedi

(57) ABSTRACT

A constraint for a sensor assembly includes a silicon wafer and a flexible structure. The silicon wafer has a first side, a second side opposite to the first side, and a passageway extending through the silicon wafer from the first side to the second side. The first side is a continuous planar surface except for the passageway. The flexible structure extends from the second side.

14 Claims, 6 Drawing Sheets

CONSTRAINT FOR A SENSOR ASSEMBLY

FIELD OF THE INVENTION

The present invention relates to a sensor assembly and, more particularly, to a constraint for a sensor assembly.

BACKGROUND

A sensor die, for example a microelectromechanical system (MEMS) sensor die, is often attached to a package by a die attach adhesive material to form a sensor assembly. The package, the die attach, and the sensor die are often formed of different materials with different coefficients of thermal expansion and different stiffnesses. When the sensor die is directly attached to the package by the die attach, thermal and mechanical stresses in the package and die attach are transferred to the sensor die, impairing the accuracy of the sensor die when used over a range of applications.

Intermediate constraints have been added to separate the sensor die from the die attach and the package in an attempt to limit the negative effects of stresses on the sensor die. A constraint made of glass helps to limit the stresses transferred to the sensor die, but is effective in a narrow range of applications, is expensive to produce, and is difficult to manufacture and process. Other suggested constraints suffer from weak bonding to the sensor die and to the package through the die attach, leading to reduced strength and early failure of the sensor assembly.

SUMMARY

A constraint for a sensor assembly includes a silicon wafer and a flexible structure. The silicon wafer has a first side, a second side opposite to the first side, and a passageway extending through the silicon wafer from the first side to the second side. The first side is a continuous planar surface except for the passageway. The flexible structure extends from the second side.

BRIEF DESCRIPTION OF THE DRAWINGS

The invention will now be described by way of example with reference to the accompanying Figures, of which.

DETAILED DESCRIPTION OF THE EMBODIMENTS

Figure 1:
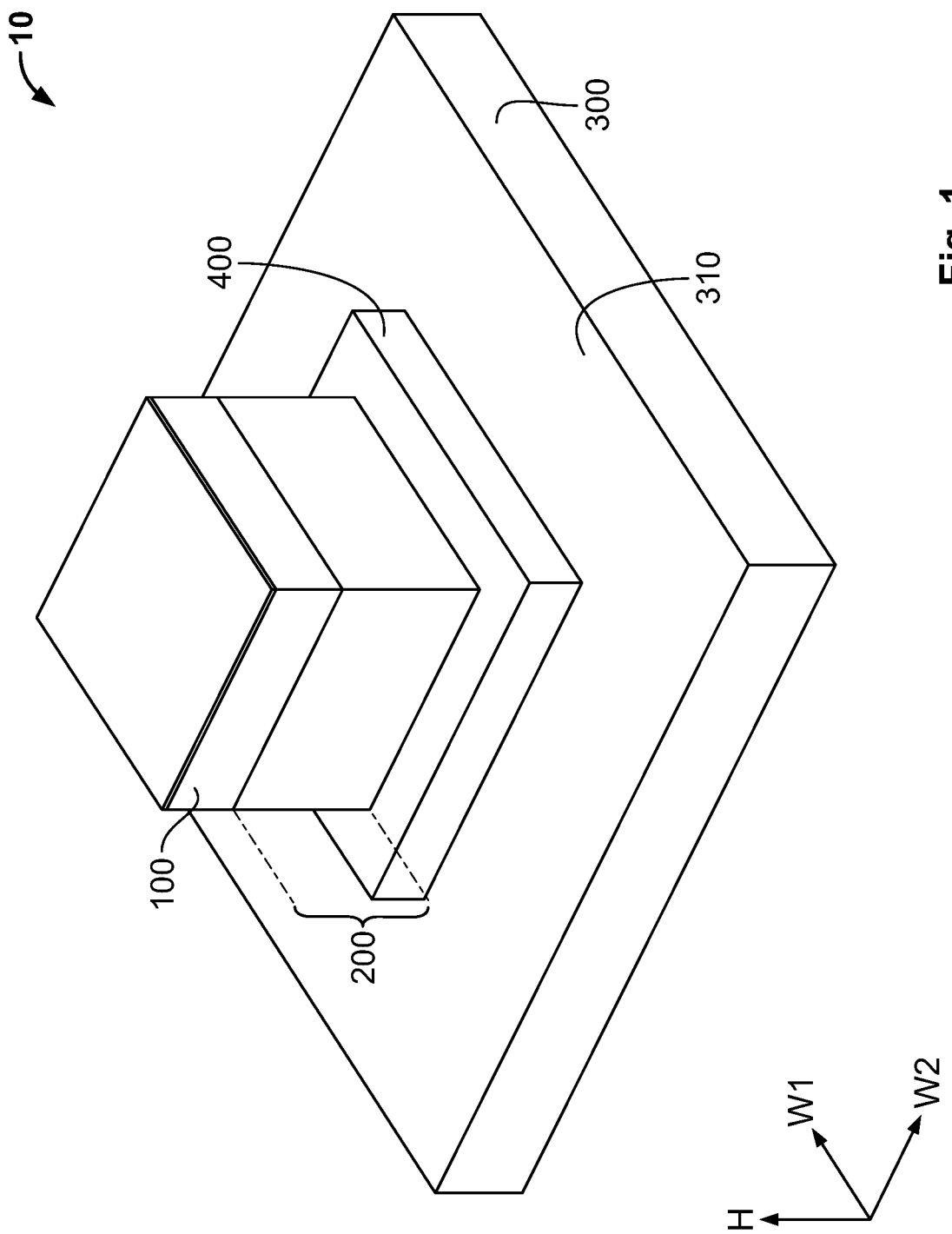
FIG. 1 is a perspective view of a sensor assembly according to an embodiment.

Exemplary embodiments of the present disclosure will be described hereinafter in detail with reference to the attached drawings, wherein like reference numerals refer to like elements. The present disclosure may, however, be embodied in many different forms and should not be construed as being limited to the embodiments set forth herein; rather, these embodiments are provided so that the present disclosure will convey the concept of the disclosure to those skilled in the art. In addition, in the following detailed description, for purposes of explanation, numerous specific details are set forth in order to provide a thorough understanding of the disclosed embodiments. However, it is apparent that one or more embodiments may also be implemented without these specific details.

Figure 2:
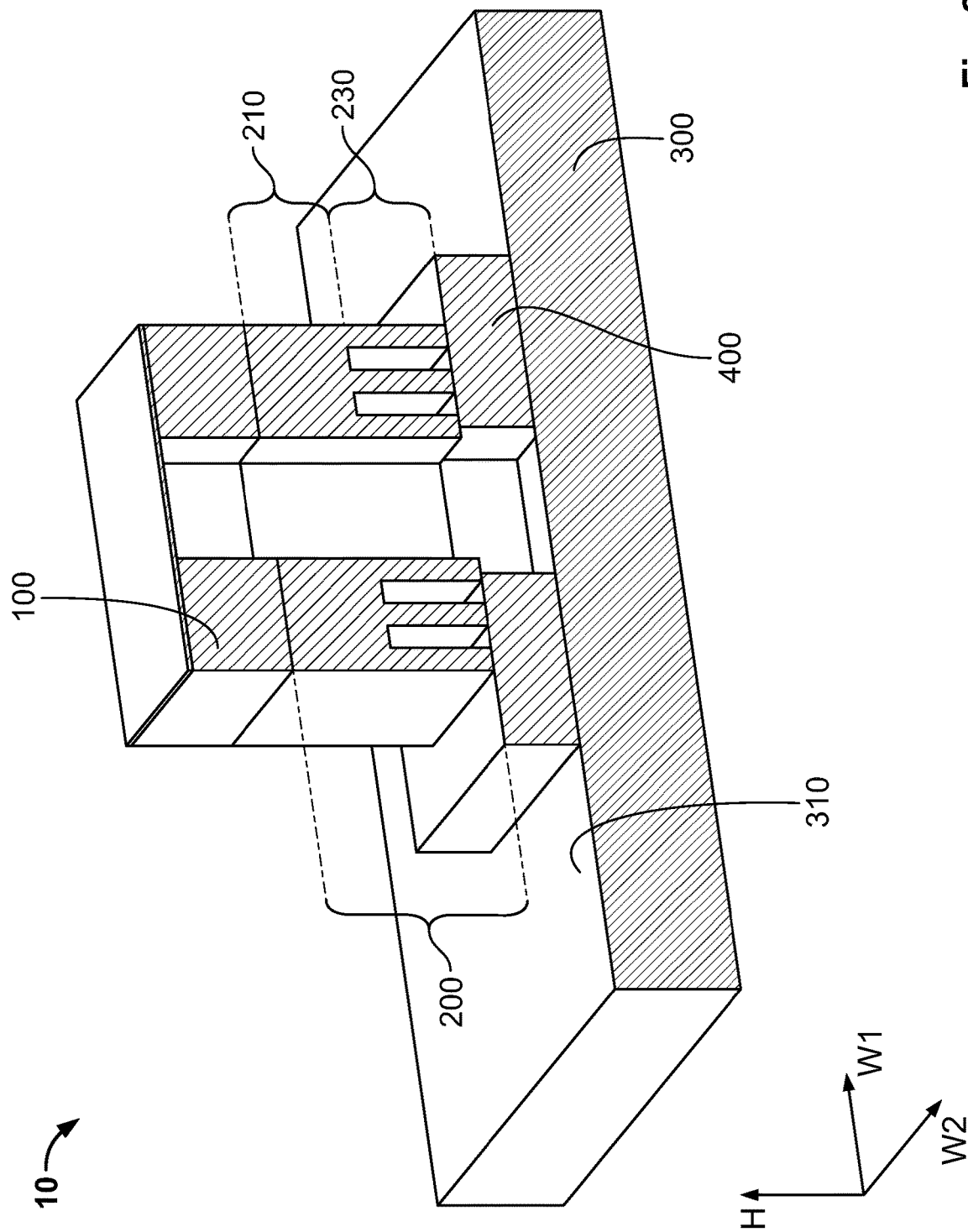
FIG. 2 is a sectional perspective view of the sensor assembly of FIG. 1.

A sensor assembly 10 according to an embodiment is shown in FIGS. 1 and 2. The sensor assembly 10 includes a sensor die 100, a constraint 200 attached to the sensor die 100, a substrate 300, and a die attach 400 attaching the constraint 200 to the substrate 300.

Figure 3:
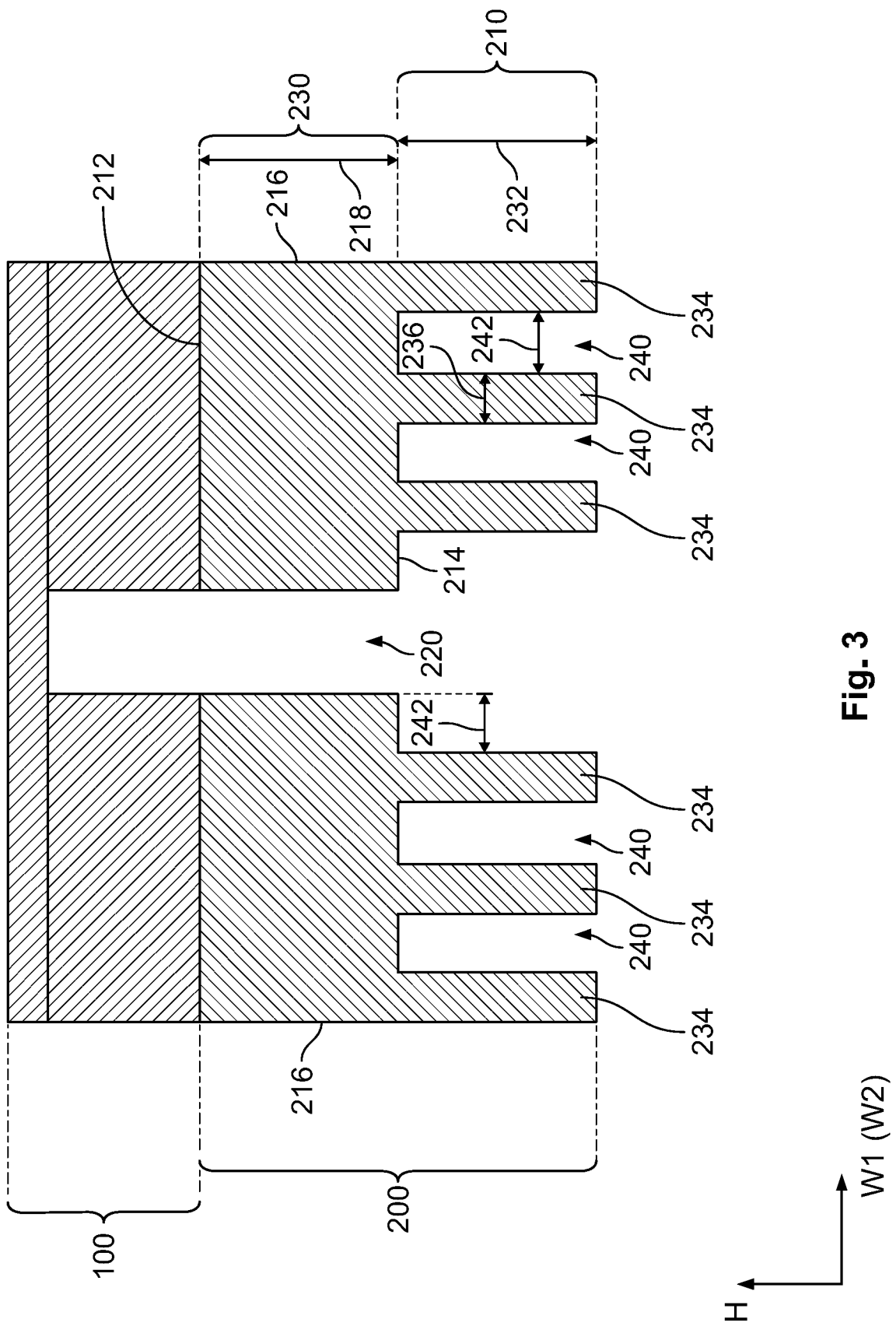
FIG. 3 is a schematic sectional side view of a sensor die and a constraint of the sensor assembly according to an embodiment.

The sensor die 100, shown in FIGS. 1-3, is a microelectromechanical system (MEMS) die used for sensing any of a range of properties. In an embodiment, the sensor die 100 is formed of a silicon material. The sensor die 100 may be a piezoresistive device having a resistance that changes in accordance with a deformation of the sensor die 100, may be a capacitive device having a capacitance that changes in accordance with the deformation of the sensor die 100, or may be any other type of MEMS sensing device. In various embodiments, the sensor die 100 may be a pressure sensor, an accelerometer, a force sensor, or any other type of sensor.

The constraint 200, shown in FIGS. 1-3, includes a silicon wafer 210 and a flexible structure 230 extending from the silicon wafer 210 in a height direction H.

The silicon wafer 210, as shown in FIG. 3, has a first side 212 and a second side 214 opposite to the first side 212 in the height direction H. The silicon wafer 210 has a plurality of lateral surfaces 216 extending between the first side 212 and the second side 214 along the height direction H. The lateral surfaces 216 form a thickness 218 of the silicon wafer 210 between the first side 212 and the second side 214 along the height direction H.

The silicon wafer 210, as shown in FIG. 3, has a passageway 220 extending through the silicon wafer 210 from the first side 212 to the second side 214 along the height direction H. In the shown embodiment, the passageway 220 extends approximately centrally through the silicon wafer 210. In the shown embodiment, the first side 212 of the silicon wafer 210 is a continuous planar surface except for the passageway 220.

The silicon wafer 210 is a wafer formed of a solid silicon material. In an embodiment, a crystal structure of the silicon material comprising the wafer 210 has a (100) plane orientation. In another embodiment, the crystal structure of the silicon material comprising the wafer 210 has a (110) plane orientation.

The flexible structure 230, as shown in FIG. 3, extends from the second side 214 of the silicon wafer 210 to a depth 232 in the height direction H. In the embodiment shown in FIG. 3, the depth 232 of the flexible structure 230 in the height direction H is approximately equal to the thickness 218 of the silicon wafer 210 in the height direction H. In other embodiments, the depth 232 could be less than or greater than the thickness 218.

Figure 4A:
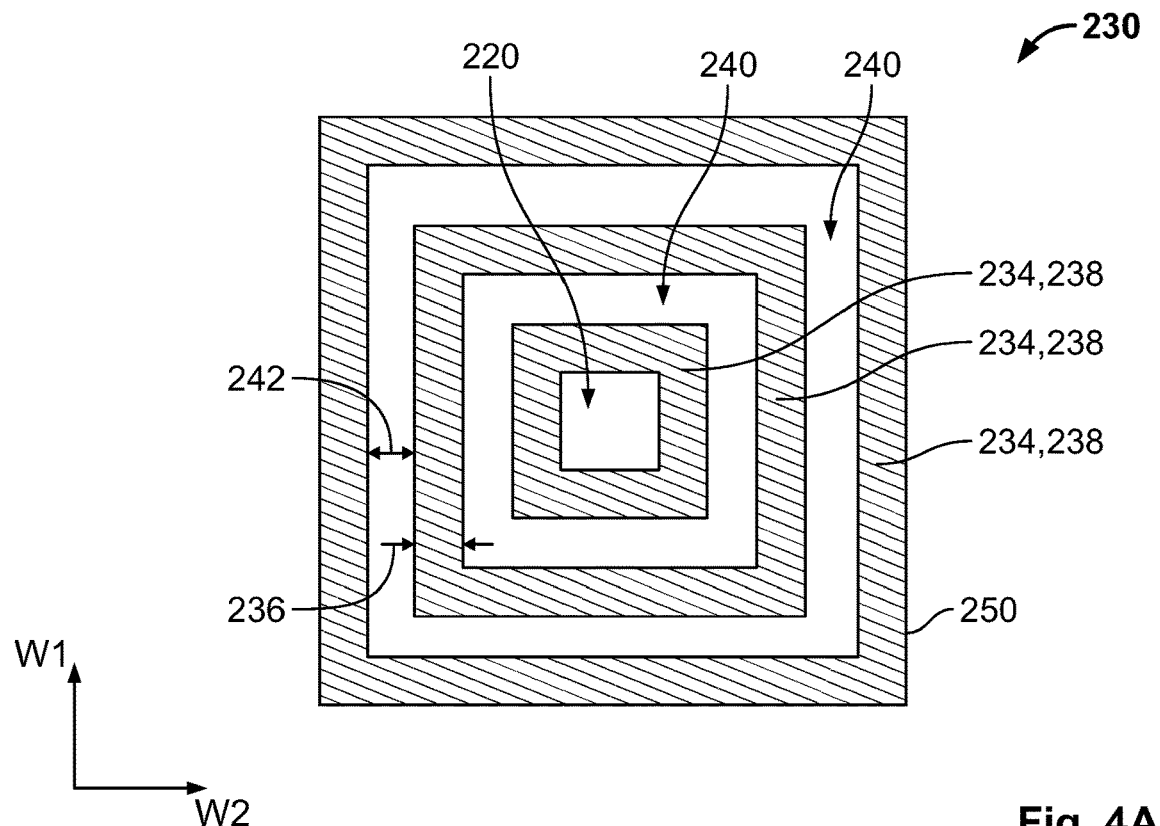
FIG. 4A is a schematic bottom view of a flexible structure of the constraint according to an embodiment.

FIG. 4A is a bottom view of the embodiment of the flexible structure 230 shown in FIG. 3. As shown in FIGS. 3 and 4A, the flexible structure 230 includes a plurality of beams 234 extending from the second side 214 and a plurality of trenches 240 disposed between and separating the beams 234 along a first width direction W1 or a second width direction W2. The beams 234, as shown in FIGS. 3 and 4A, are disposed concentric to one another about the passageway 220.

As shown in FIGS. 1 and 2, the first width direction W1 is perpendicular to the height direction H and the second width direction W2 is perpendicular to both the first width direction W1 and the height direction H. Both the first width direction W1 and the second width direction W2 are denoted as the same axis in FIG. 3 because, in the embodiment shown in FIGS. 1-4A, a section of the sensor die 100 and the constraint 200 taken along either the first width direction W1 or the second width direction W2 of FIGS. 1 and 2 has the same structure shown in FIG. 3. The first width direction W1 and the second width direction W2 may be referred to in the alternative as a width direction W1, W2 with reference to the embodiment of FIGS. 1-4A.

As shown in FIGS. 3 and 4A, the beams 234 each have a beam width 236 in a width direction W1, W2 and the trenches 240 each have a spacing 242 between a pair of beams 234 of the plurality of beams 234 in the width direction W1, W2. Each of the beams 234 has a same beam width 236 and each of the trenches 240 has a same spacing 242 in the shown embodiment. In the embodiment shown in FIGS. 3 and 4A, the beam width 236 is approximately equal to the spacing 242. In other embodiments, the beam width 236 may be less than or greater than the spacing 242 in the width direction W1, W2. In the embodiment shown in FIG. 3, each of the beams 234 is spaced apart from the passageway 220 by at least the spacing 242 in the width direction W1, W2. In other embodiments, the beams 234 may be spaced closer to or further from the passageway 220 than the spacing 242.

Each of the beams 234, as shown in FIG. 3, extends parallel to the height direction H; opposite sides of the beams 234 in the width direction W1, W2 are each planar and parallel to the height direction H. In the embodiment shown in FIG. 3, an outermost surface in the width direction W1, W2 of an outermost beam 234 of the plurality of beams 234 is flush with one of the lateral surfaces 216 of the silicon wafer 210.

Each of the beams 234, as shown in FIG. 4A, have a cross-sectional shape 238 in a plane extending along the first width direction W1 and the second width direction W2. In the embodiment shown in FIG. 4A, the cross-sectional shape 238 of each of the beams 234 is a square shape.

Other exemplary embodiments of the flexible structure 230 are shown in FIGS. 4B-4E. Like reference numbers refer to like elements and primarily the differences with respect to the embodiment described above in FIGS. 3 and 4A will be described in detail herein.

Figure 4B:
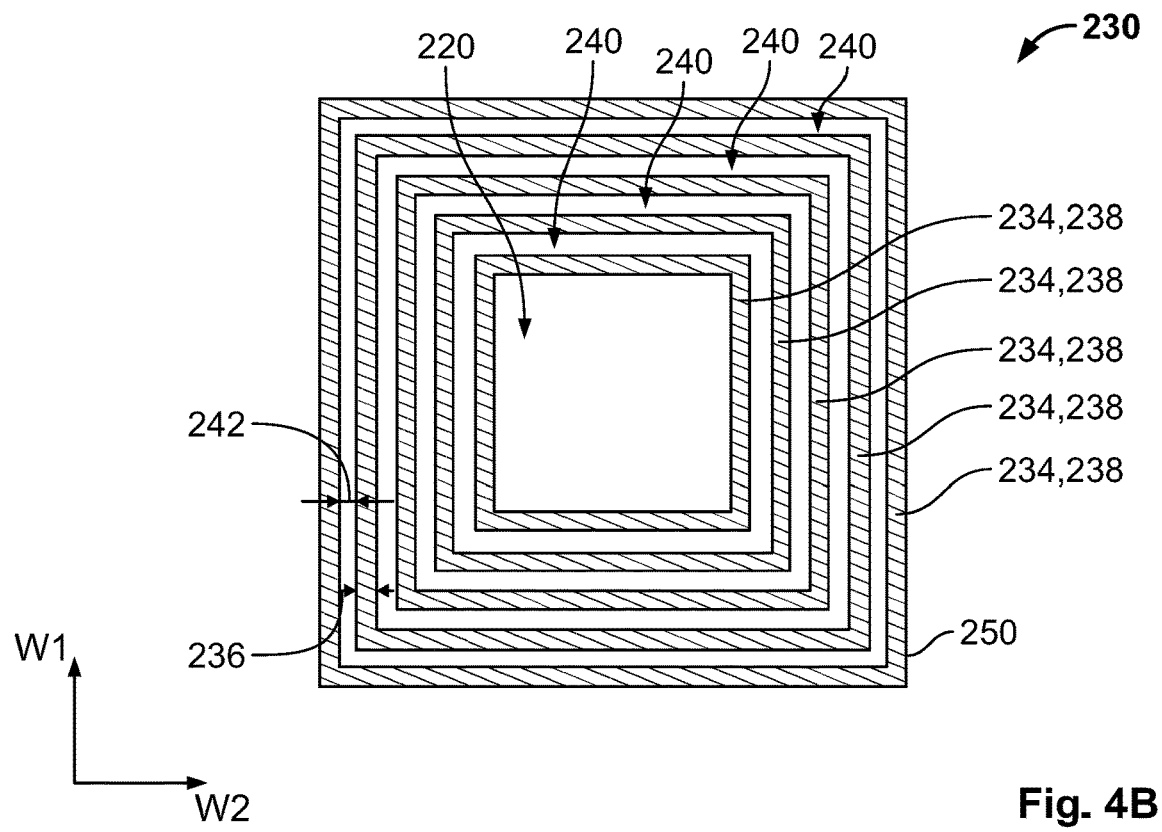
FIG. 4B is a schematic bottom view of a flexible structure of the constraint according to another embodiment.
Figure 4C:
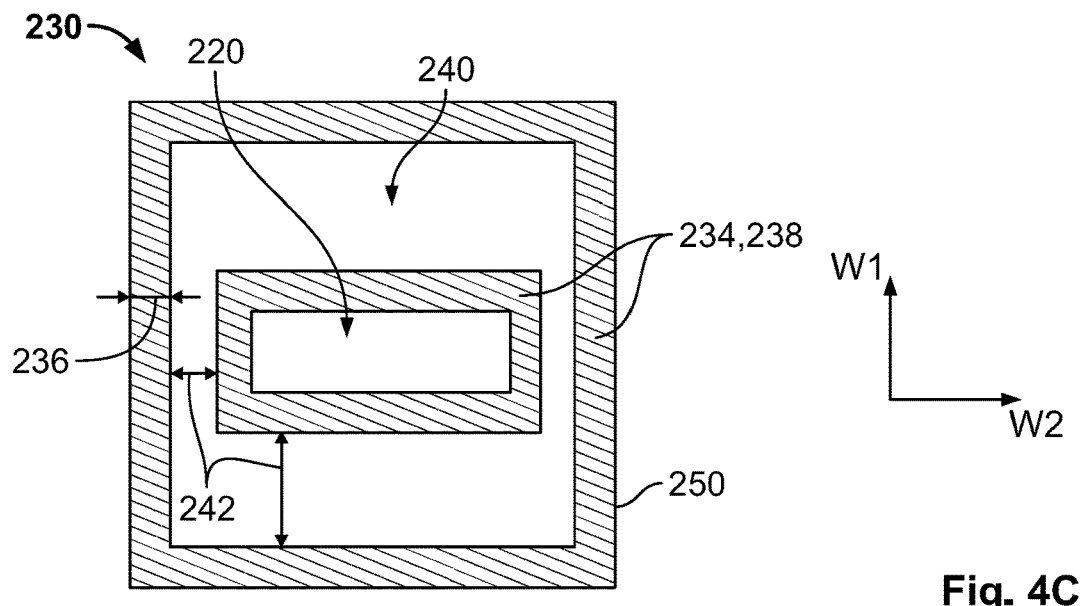
FIG. 4C is a schematic bottom view of a flexible structure of the constraint according to another embodiment.

As shown in the embodiments of FIGS. 4B and 4C, the number of beams 234 can vary from the three beams 234 shown in FIG. 4A. The flexible structure 230 has five beams 234 in the embodiment shown in FIG. 4B and two beams 234 in the embodiment of FIG. 4C; the flexible structure 230 in other embodiments could have four beams 234, more than five beams 234, or any number of beams 234.

The exemplary embodiment of FIG. 4B also shows that the beam width 236 and the spacing 242 can vary from the embodiment shown in FIG. 4A. The beams 234 and the trenches 242, as shown in FIG. 4B, could have smaller beam widths 236 and smaller spacings 242 than in the embodiment of FIG. 4A. In other embodiments, the beam widths 236 and spacings 242 could be larger than in the embodiment shown in FIG. 4A. In the embodiment shown in FIG. 4B, the beam widths 246 are still the same for all of the beams 234 and the spacings 242 are still the same for all of the trenches 240 concentrically around the passageway 220.

Figure 4D:
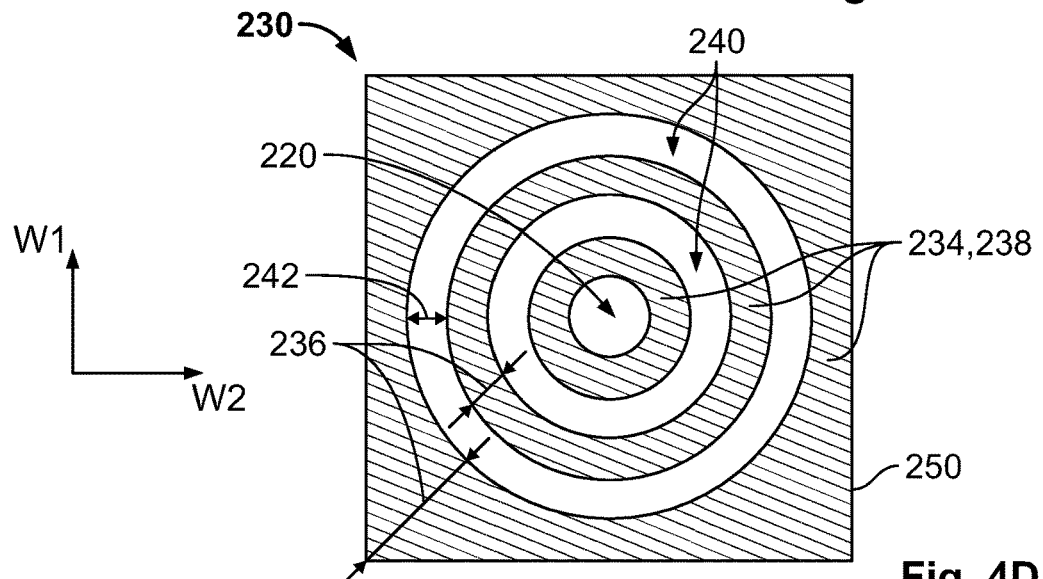
FIG. 4D is a schematic bottom view of a flexible structure of the constraint according to another embodiment.
Figure 4E:
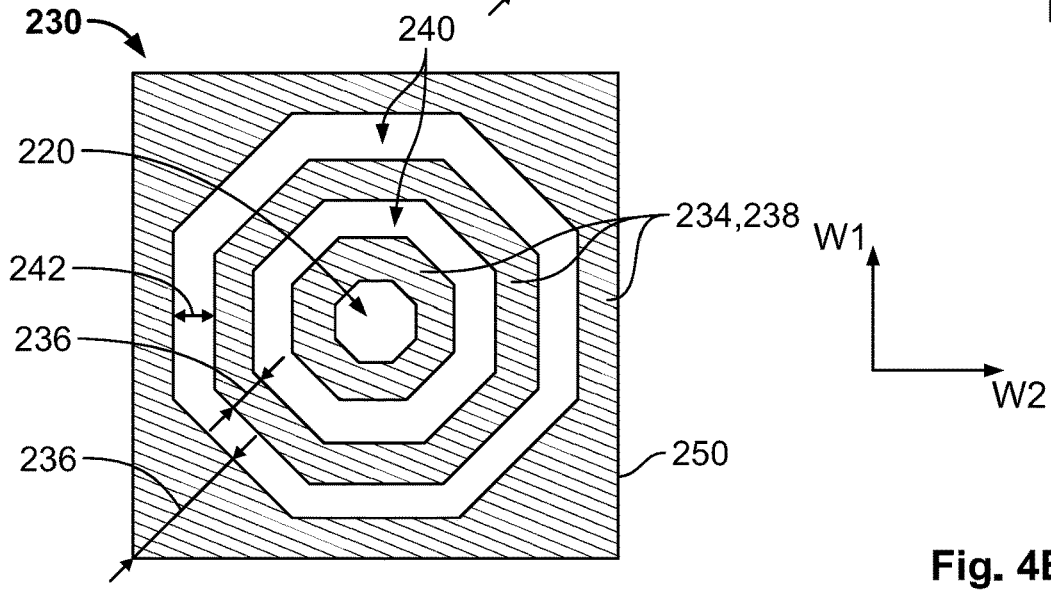
FIG. 4E is a schematic bottom view of a flexible structure of the constraint according to another embodiment.

In the embodiment shown in FIG. 4B, each of the beams 234 has the square cross-sectional shape 238 as in the embodiment of FIG. 4A. In other embodiments, the cross-sectional shape 238 of the beams 234 could be rectangular as shown in FIG. 4C, circular as shown in FIG. 4D, hexagonal as shown in FIG. 4E, or any other type of shape. In the embodiments shown in FIGS. 4A-4E, despite differences in the cross-sectional shape 238 of the beams 234, the flexible structure 230 has an outer perimeter profile 250 with a square shape. In other embodiments, the outer perimeter profile 250 could have a rectangular shape, a hexagonal shape, an octagonal shape, a star shape, or any other type of shape.

The beams 234 within the flexible structure 230 can have different beams widths 236 from one another and the trenches 240 within the flexible structure 230 can have different spacings 242 from one another, as shown in the embodiments of FIGS. 4C-4E. The different cross-sectional shapes 238 of the beams 234 with the square outer perimeter profile 250 results in a variable spacing 242 between the beams 234 in the first width direction W1 as compared to the second width direction W2 in the embodiment shown in FIG. 4C. A variable beam width 236 of an outermost beam 234 in the embodiments shown in FIGS. 4D and 4E. In other embodiments, any of the beams 234 in the flexible structure 230 can have variable and/or different widths from one another and any of the trenches 240 can have variable and/or different spacings 242 from one another.

The beams 234 of the flexible structure 230, according to any of the embodiments described above, are monolithically formed in a single piece with the silicon wafer 210. The silicon wafer 210 begins as a piece of the solid silicon material having a dimension in the height direction H equal to a sum of the thickness 218 and the depth 232. The silicon wafer 210 is etched by an etching process up to the second side 214, forming the beams 234 and the trenches 240 between the beams 234 shown in FIGS. 3-4E. In an embodiment, the passageway 220 is also formed by the etching process, by etching the silicon wafer 210 from a same side as the beams 234 and also etching the silicon wafer 210 from the first side 212 to form the passageway 220 extending through the silicon wafer 210.

In an embodiment, the etching process is a dry plasma etching, such as a deep reactive-ion etching (DRIE). The DRIE, in an embodiment, is used to form the beams 234 when the silicon wafer 210 has the (100) plane orientation. The DRIE etching allows the creation of vertical sides of the beams 234 that are parallel to the height direction H when the silicon wafer 210 has the (100) plane orientation.

In another embodiment, the etching process is a wet etching. The wet etching, in an embodiment, is used to form the beams 234 when the silicon wafer 210 has the (110) plane orientation. The wet etching is less expensive than the DRIE while allowing the creation of vertical sides of the beams 234 that are parallel to the height direction H when the silicon wafer 210 has the (110) plane orientation.

The substrate 300, shown in FIGS. 1 and 2, forms or is a portion of a package for the sensor die 100, and can be formed from any type of material used in sensor die packaging. In an embodiment, the substrate 300 has a different coefficient of thermal expansion and/or a different stiffness or Young's modulus than the sensor die 100.

The die attach 400, shown in FIGS. 1 and 2, is an adhesive material having a liquid state and a solid state under different temperatures. In an embodiment, in the solid state, the die attach 400 is a hard die attach such as a glass material, a solder material, or any other type of hard material used in attaching sensor dies. In another embodiment, in the solid state, the die attach 400 is a soft die attach such as an epoxy, a thermoplastic, or any other type of soft material used in attaching sensor dies. In various embodiment, the die attach 400 has a different thermal coefficient of expansion than at least one of the sensor die 100 and the substrate 300, and a different stiffness or Young's modulus than at least one of the sensor die 100 and the substrate 300.

The assembly of the sensor assembly 10 will now be described in greater detail primarily with respect to FIGS. 1-3 and 5.

As shown in FIGS. 1-3 and 5, the constraint 200 is attached to the sensor die 100. In the shown embodiment, the constraint 200 is attached to the sensor die 100 by a fusion bond. In other embodiments, the constraint 200 may be attached to the sensor die 100 by any type of attachment that is usable with silicon material.

Figure 5:
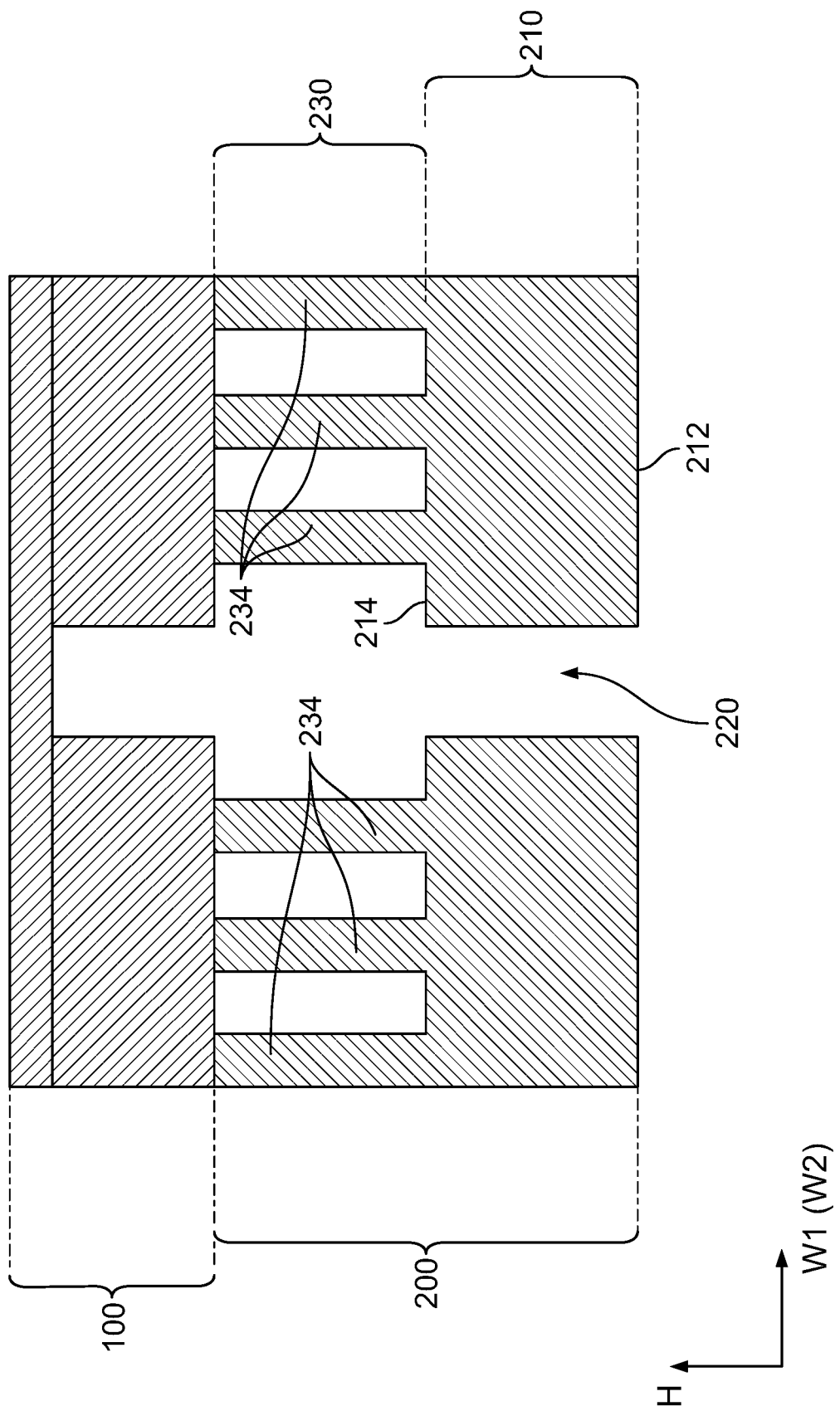
FIG. 5 is a schematic sectional side view of a sensor die and a constraint of the sensor assembly according to another embodiment.

In the embodiment shown in FIG. 3, the first side 212 of the silicon wafer 210 is attached to the sensor die 100 and the flexible structure 230 is positioned on an opposite side of the silicon wafer 210 from the sensor die 100 in the height direction H. In another embodiment, shown in FIG. 5, the flexible structure 230 is attached to the sensor die 100 with ends of the beams 234 opposite the silicon wafer 210 attached to the sensor die 100. In the embodiment of FIG. 5, the sensor die 100 is positioned on a side of the flexible structure 230 opposite the silicon wafer 210 in the height direction H.

The constraint 200 attached to the sensor die 100 is attached to a surface 310 of the substrate 300 by the die attach 400, as shown in FIGS. 1 and 2. The die attach 400 is applied in a liquid state between the surface 310 and the constraint 200 and transitions to a solid state to secure the constraint 200 and the sensor die 100 to the substrate 300.

As shown in the embodiments of FIGS. 1-3 and 5, either the silicon wafer 210 can be attached to the sensor die 100 and the flexible structure 230 can be attached to the substrate 300 by the die attach 400, or the flexible structure 230 can be attached to the sensor die 100 and the silicon wafer 210 can be attached to the substrate 300 by the die attach 400. The orientation of the constraint 200 shown in FIG. 5 may limit or prevent possible wicking of the die attach 400 in the liquid state between the beams 234 of the flexible structure 230.

In an assembled state of the sensor assembly 10 as shown in FIGS. 1 and 2, the constraint 200 is disposed between and separates the sensor die 100 from the substrate 300 and the die attach 400 in the height direction H. During use of the sensor assembly 10, the flexible structure 230 provides flexibility to the constraint 200 that allows part of the constraint 200 to move. The movement of the constraint 200 isolates or limits stresses in the die attach 400 or the substrate 300, such as thermal or mechanical stresses, from the sensor die 100, improving the accuracy and consistency of the sensor die 100 across a range of temperatures.

The constraint 200 creates this improved performance regardless of what type of die attach 400 is used. The constraint 200 is also usable with different types sensor dies 100 sensing different characteristics in different ranges. The sensor assembly 10 allows the sensor die 100 to be isolated from the stresses such that it has a temperature coefficient of zero (TCZ) offset that is largely linear and nearly identical to the TCZ offset of a bare sensor die without the constraint 200, substrate 300, and die attach 400 across a range of different temperatures and for different types of sensor die 100; the TCZ offset of the sensor die 100 in the sensor assembly 10 more closely follows the TCZ offset of the bare sensor die than sensor assemblies including other types of constraints.

Further, the flexible structure 230 extending from the second side 214 of the silicon wafer 210 allows the first side 212 to be a continuous planar surface except for the passageway 220, improving the strength of a connection between the constraint 200 and the sensor die 100 or between the constraint 200 and the substrate 300.

What is claimed is:

1. A constraint for a sensor assembly, comprising:
   a silicon wafer having a first side, a second side opposite to the first side, and a passageway extending through the silicon wafer from the first side to the second side, the first side is a continuous planar surface except for the passageway; and
   a flexible structure extending from the second side and aligned with an outermost lateral surface of the silicon wafer in a height direction extending between the first side and the second side of the silicon wafer, the flexible structure includes a plurality of beams and at least one trench disposed between the plurality of beams, a total width of the silicon wafer outside of the passageway in a width direction perpendicular to the height direction is greater than a total width of the beams in the width direction.

2. The constraint of claim 1, wherein the silicon wafer has a thickness in the height direction, the flexible structure has a depth in the height direction, the depth is equal to the thickness.

3. The constraint of claim 1, wherein each of the plurality of beams has a cross-sectional shape, the cross-sectional shape is a square, a rectangular, a circular, or a hexagonal shape.

4. The constraint of claim 1, wherein each of the beams extends parallel to the height direction.

5. The constraint of claim 4, wherein one of the beams is flush with the outermost lateral surface of the silicon wafer.

6. The constraint of claim 1, wherein the beams each have a beam width in the width direction and the trenches each have a spacing between the beams in the width direction, the beam width is equal to the spacing.

7. The constraint of claim 6, wherein each of the beams is spaced apart from the passageway by at least the spacing in the width direction.

8. The constraint of claim 1, wherein the plurality of beams are concentric to one another about the passageway.

9. The constraint of claim 1, wherein the plurality of beams are monolithically formed in a single piece with the silicon wafer.

10. The constraint of claim 9, wherein the plurality of beams are etched into the silicon wafer.

11. The constraint of claim 10, wherein the silicon wafer has a (100) plane orientation and the plurality of beams are etched by deep reactive-ion etching.

12. The constraint of claim 10, wherein the silicon wafer has a (110) plane orientation and the plurality of beams are etched by wet etching.

13. The constraint of claim 1, wherein the flexible structure is formed of a same material as the silicon wafer.

14. The constraint of claim 1, wherein the passageway of the silicon wafer is the only passageway extending through the silicon wafer from the first side to the second side.

* * * * *